(12) United States Patent
Pagaila et al.

(10) Patent No.: US 8,581,370 B2
(45) Date of Patent: Nov. 12, 2013

(54) SEMICONDUCTOR DEVICE AND METHOD OF FORMING PREFABRICATED EMI SHIELDING FRAME WITH CAVITIES CONTAINING PENETRABLE MATERIAL OVER SEMICONDUCTOR DIE

(75) Inventors: Reza A. Pagaila, Singapore (SG); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 86 days.

(21) Appl. No.: 13/349,829

(22) Filed: Jan. 13, 2012

(65) Prior Publication Data

US 2012/0112326 A1     May 10, 2012

Related U.S. Application Data

(62) Division of application No. 12/792,066, filed on Jun. 2, 2010, now Pat. No. 8,105,872.

(51) Int. Cl.
*H01L 23/552* (2006.01)
(52) U.S. Cl.
USPC .................................. 257/659; 257/E23.114
(58) Field of Classification Search
None
See application file for complete search history.

(56) References Cited

U.S. PATENT DOCUMENTS

| 5,250,843 | A | 10/1993 | Eichelberger |
| 5,353,498 | A | 10/1994 | Fillion et al. |
| 5,841,193 | A | 11/1998 | Eichelberger |
| 7,018,866 | B2 | 3/2006 | Sugaya et al. |
| 7,619,901 | B2 | 11/2009 | Eichelberger et al. |
| 7,799,602 | B2 | 9/2010 | Pagaila et al. |
| 7,884,484 | B2 | 2/2011 | Yamano et al. |
| 7,955,942 | B2 | 6/2011 | Pagaila et al. |
| 2009/0127680 | A1 | 5/2009 | Do et al. |

*Primary Examiner* — Seahvosh Nikmanesh
(74) *Attorney, Agent, or Firm* — Robert D. Atkins; Patent Law Group: Atkins & Associates, P.C.

(57) ABSTRACT

A semiconductor device has a plurality of semiconductor die mounted to a temporary carrier. A prefabricated shielding frame has a plate and integrated bodies extending from the plate. The bodies define a plurality of cavities in the shielding frame. A penetrable material is deposited in the cavities of the shielding frame. The shielding frame is mounted over the semiconductor die such that the penetrable material encapsulates the die. The carrier is removed. An interconnect structure is formed over the die, shielding frame, and penetrable material. The bodies of the shielding frame are electrically connected through the interconnect structure to a ground point. The shielding frame is singulated through the bodies or through the plate and penetrable material to separate the die. TIM is formed over the die adjacent to the plate of the shielding frame. A heat sink is mounted over the plate of the shielding frame.

25 Claims, 15 Drawing Sheets

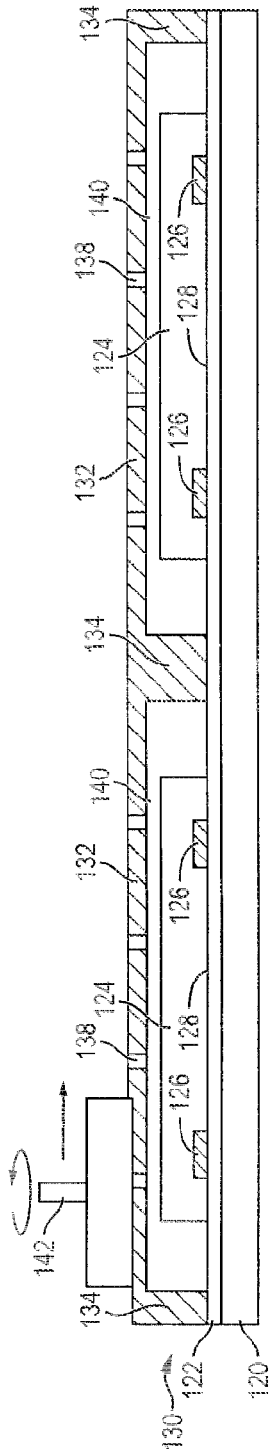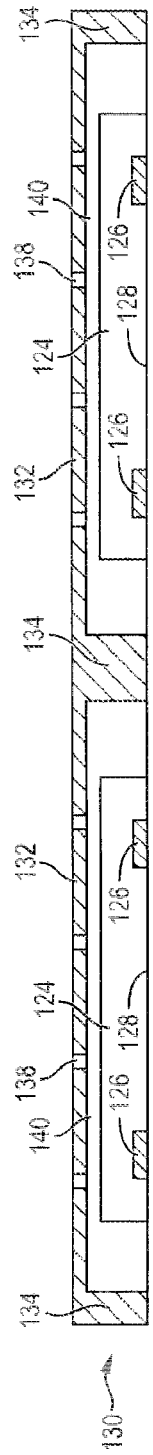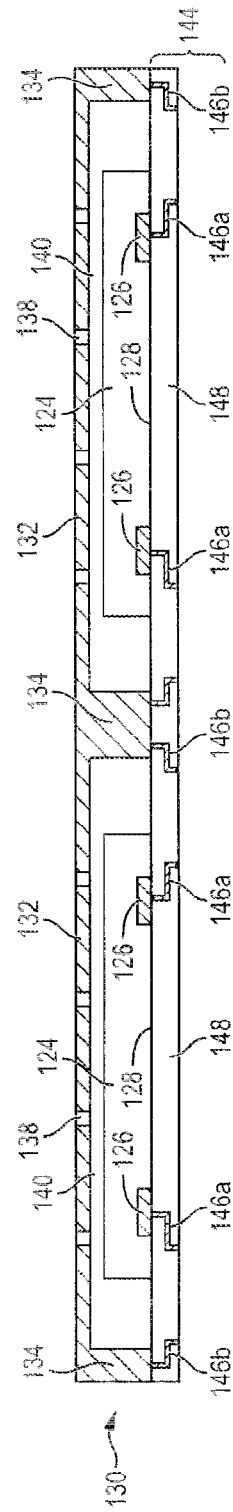
FIG. 4h
FIG. 4i
FIG. 4j

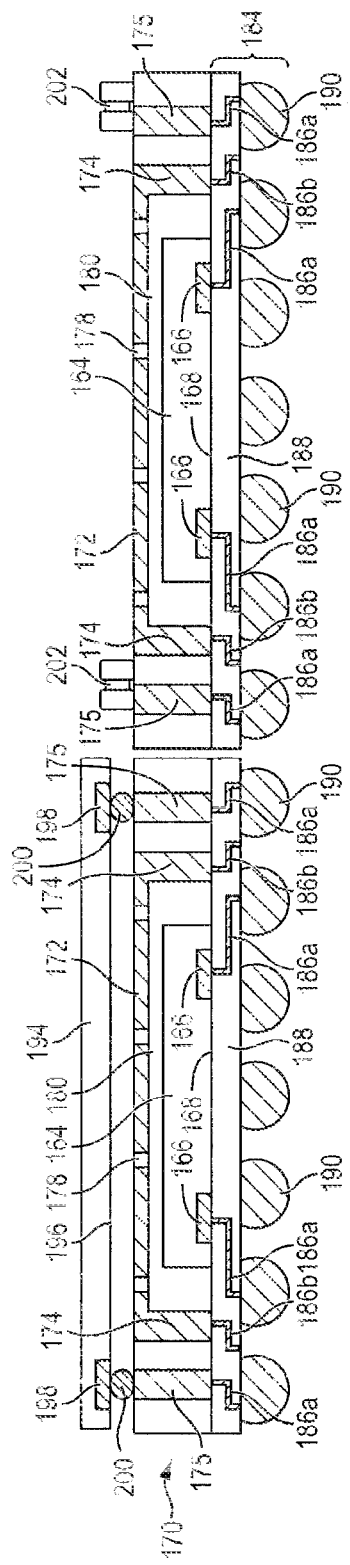
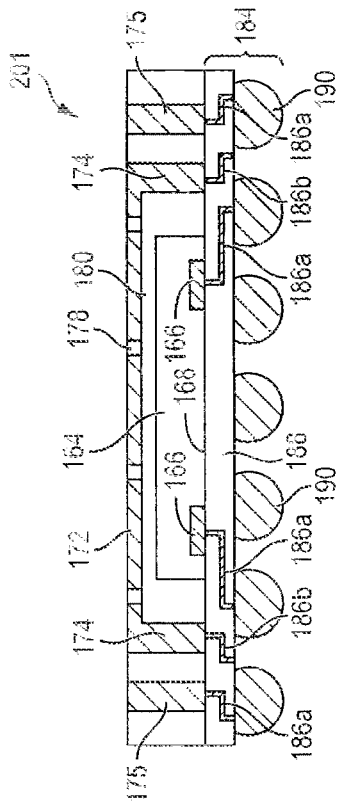
FIG. 6i
FIG. 7

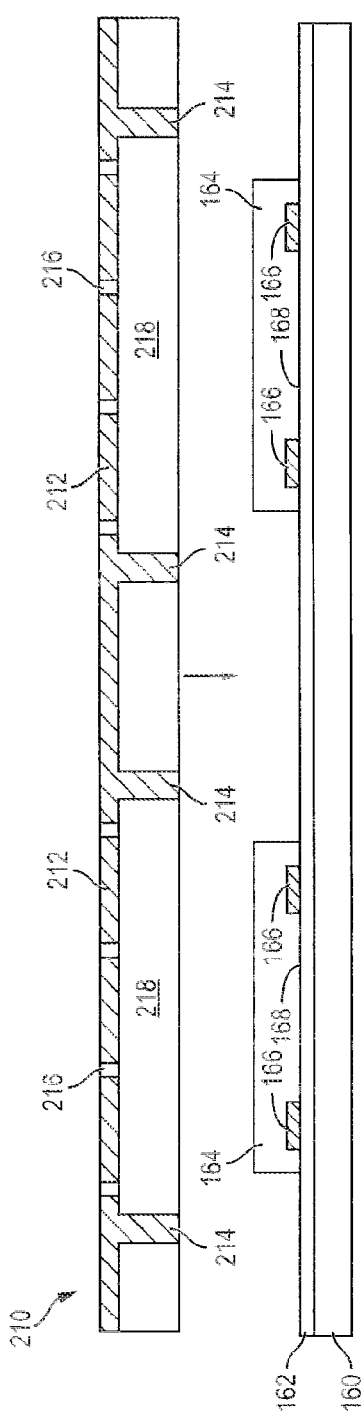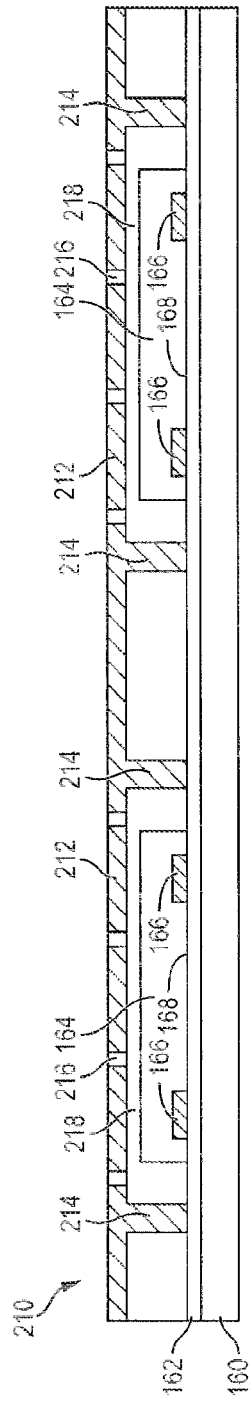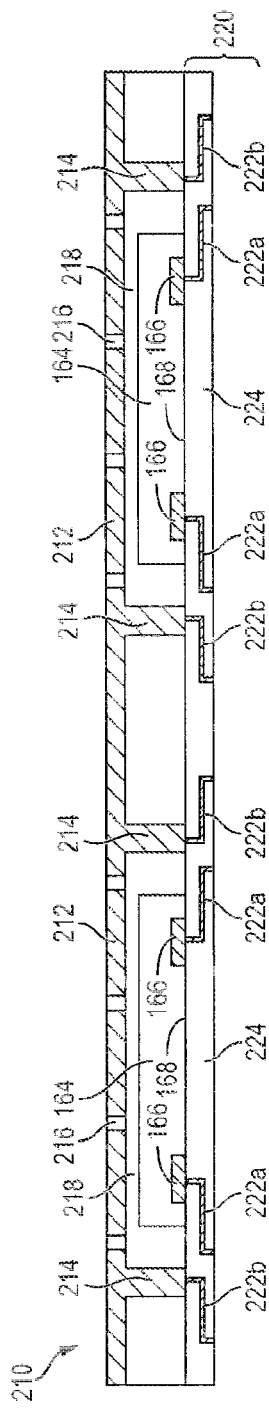

SEMICONDUCTOR DEVICE AND METHOD OF FORMING PREFABRICATED EMI SHIELDING FRAME WITH CAVITIES CONTAINING PENETRABLE MATERIAL OVER SEMICONDUCTOR DIE

CLAIM TO DOMESTIC PRIORITY

The present application is a division of U.S. patent application Ser. No. 12/792,066, now U.S. Pat. No. 8,105,872, filed Jun. 2, 2010, and claims priority to the foregoing parent application pursuant to 35 U.S.C. §121.

FIELD OF THE INVENTION

The present invention relates in general to semiconductor devices and, more particularly, to a semiconductor device and method of forming a prefabricated EMI shielding frame with cavities containing penetrable material over a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk, which can interfere with device operation.

FIG. 1 illustrates semiconductor package 10 containing semiconductor die 12 covered by encapsulant 14. An interconnect structure 16 with bumps 17 is formed over semiconductor die 12 and encapsulant 14 for electrical interconnect. A shielding layer 18 is conformally applied over encapsulant 14 to block or absorb EMI, RFI, and other inter-device interference. Shielding layer 18 is grounded through conductive trace 20 to interconnect structure 16 and bumps 17. The conformal shielding layer 18 typically requires specialized equipment, which increases manufacturing costs. In addition, the deposition of encapsulant 14 can cause die shifting which can affect alignment of interconnect structure 16.

SUMMARY OF THE INVENTION

A need exists to shield semiconductor die from EMI, RFI, and other inter-device interference. Accordingly, in one embodiment, the present invention is a semiconductor device comprising a first semiconductor die. A shielding frame is mounted over the first semiconductor die. The shielding frame has a plate and a body integrated with and extending from the plate to define a cavity. An encapsulant is deposited in the cavity. A plurality of openings is formed in the shielding frame to enable excess encapsulant to escape. An interconnect structure is formed over the first semiconductor die.

In another embodiment, the present invention is a semiconductor device comprising a first semiconductor die. A shielding frame is mounted over the first semiconductor die. The shielding frame has a plate with a plurality of openings and a body integrated with and extending from the plate to define a cavity. An encapsulant is deposited in the cavity. An interconnect structure is formed over the first semiconductor die.

In another embodiment, the present invention is a semiconductor device comprising a first semiconductor die. A shielding frame is mounted over the first semiconductor die. The shielding frame has a cavity and a plurality of openings. An encapsulant is deposited in the cavity. An interconnect structure is formed over the first semiconductor die.

In another embodiment, the present invention is a semiconductor device comprising a first semiconductor die. A shielding frame is mounted over the first semiconductor die. The shielding frame has a cavity and a plurality of openings. An encapsulant is deposited in the cavity.

BRIEF DESCRIPTION OF THE DRAWINGS

FIGS. 4a-4k illustrate a process of forming a prefabricated EMI shielding frame with cavities containing penetrable material over a semiconductor die;

FIGS. 6a-6i illustrate a process of forming the shielding frame with additional z-direction conductive pillars;

FIG. 7 illustrates the FO-WLCSP with the shielding frame and additional z-direction conductive pillars;

FIGS. 8a-8d illustrate another process of forming a prefabricated EMI shielding frame with cavities containing penetrable material over a semiconductor die;

DETAILED DESCRIPTION OF THE DRAWINGS

Figure 1:
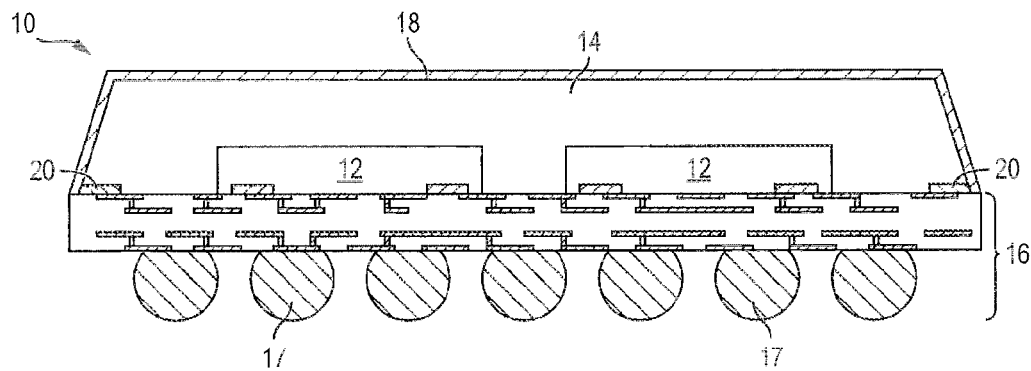
FIG. 1 illustrates a conventional semiconductor die covered by conformal shielding layer formed over encapsulant.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
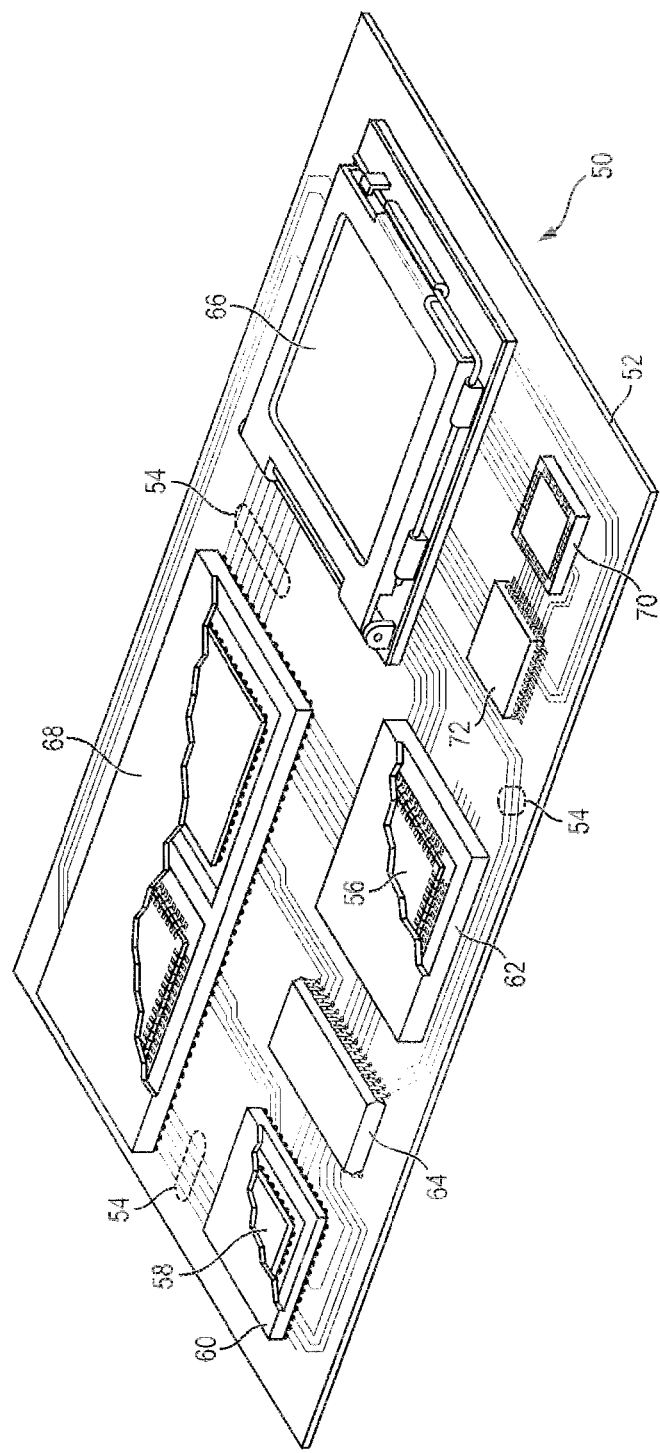
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
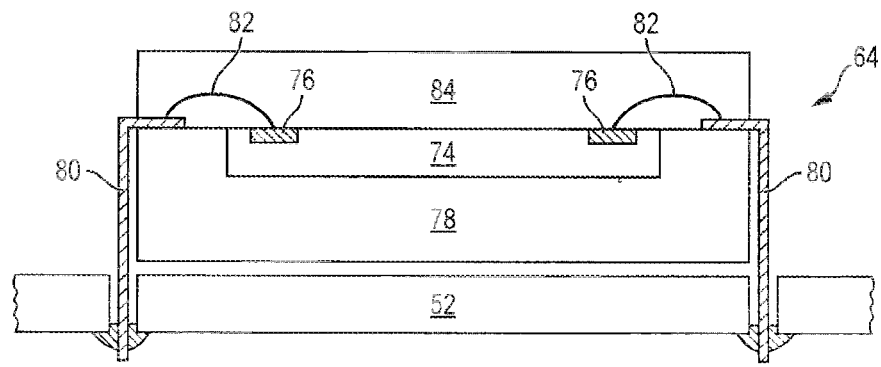
FIGS. 3a-3c illustrate further detail of the representative semiconductor packages mounted to the PCB.
Figure 3B:
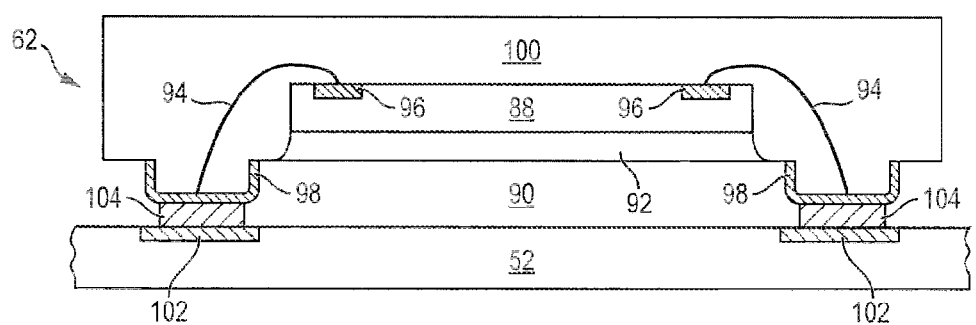
Figure 3C:
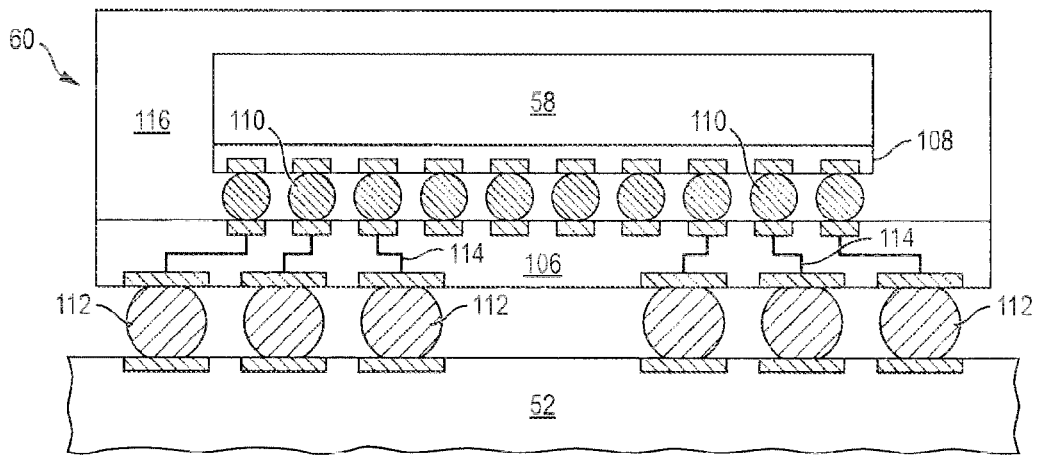

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
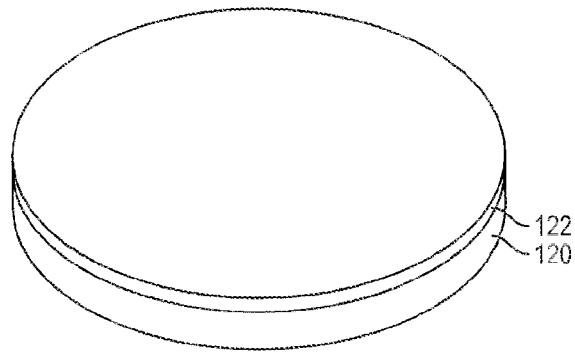

FIGS. 4a-4k illustrate, in relation to FIGS. 2 and 3a-3c, a process of forming a prefabricated EMI shielding frame with cavities containing penetrable material over a semiconductor die. In FIG. 4a, a wafer-form temporary carrier or dummy wafer substrate 120 contains sacrificial base material such as silicon, polymer, polymer composite, metal, ceramic, glass, glass epoxy, beryllium oxide, or other suitable low-cost, rigid material or bulk semiconductor material for structural support. An optional interface layer 122 can be formed over carrier 120 as a temporary adhesive bonding film or etch-stop layer.

Figure 4C:
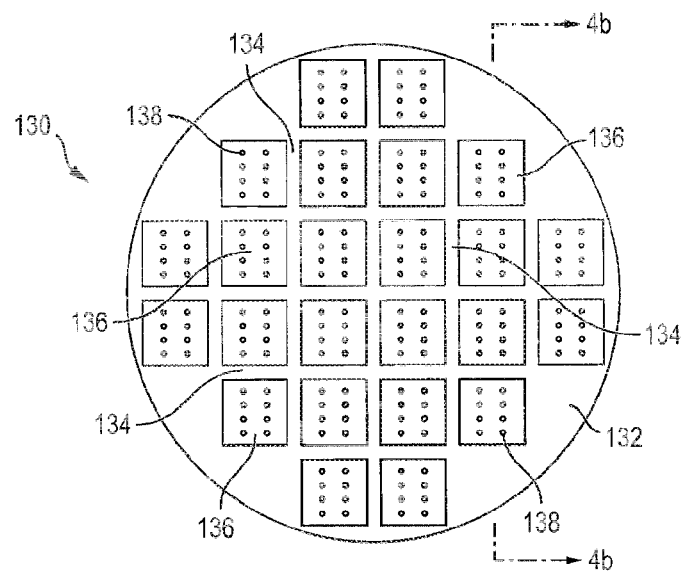
Figure 4B:
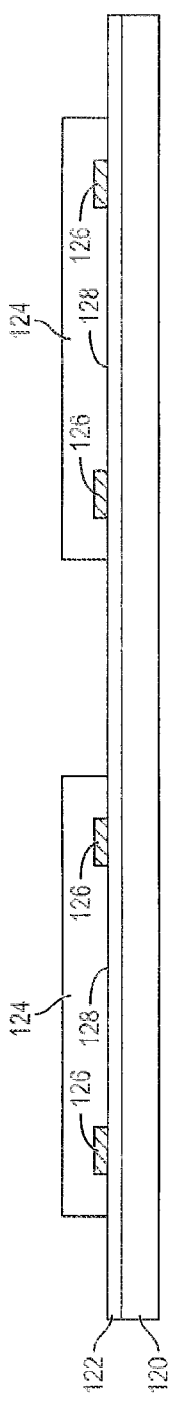

FIG. 4b shows a portion of carrier 120 with a plurality of semiconductor die or components 124 mounted to interface layer 122 using a pick and place operation. Contact pads 126 formed over active surface 128 of semiconductor die 124 are oriented downward toward carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processing (DSP), ASIC, memory, or other signal processing circuit. Semiconductor die 124 may also contain IPDs, such as inductors, capacitors, and resistors, for RF signal processing. In one embodiment, semiconductor die 124 is a flipchip type semiconductor die.

Figure 4D:
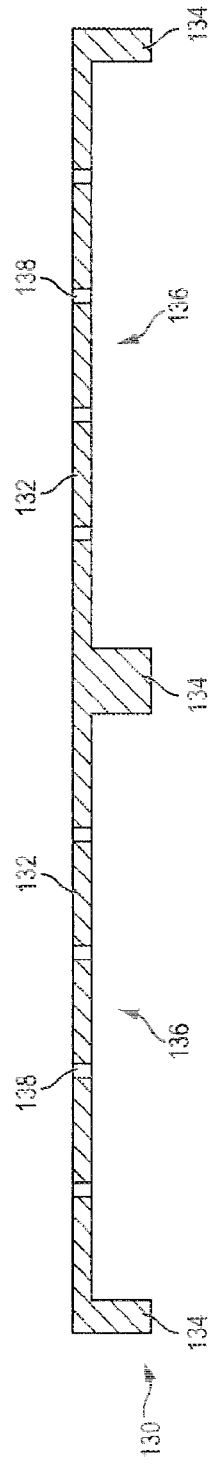

FIGS. 4c-4d show a top view and cross-sectional view of EMI and RFI shielding frame 130 with a flat plate 132 and plurality of bodies 134 integrated with and extending perpendicular from the plate. Shielding frame 130 has a similar wafer-shape or form factor as carrier 120, as shown in FIG. 4c. In one embodiment, shielding frame 130 is Cu prefabricated using a leadframe manufacturing process to reduce manufacturing costs. Alternatively, shielding frame 130 can be Al, ferrite or carbonyl iron, stainless steel, nickel silver, low-carbon steel, silicon-iron steel, foil, conductive resin, and other metals and composites capable of blocking or absorbing EMI, RFI, and other inter-device interference. Shielding frame 130 can also be a non-metal material such as carbon-black or aluminum flake to reduce the effects of EMI and RFI. Bodies 134 extend from plate 132 to define cavities or recessed openings 136. Bodies 134 are sufficiently thick to extend down to carrier 120 when shielding frame 130 is mounted over semiconductor die 124. A plurality of openings or mesh 138 is formed in plate 132.

Figure 4E:
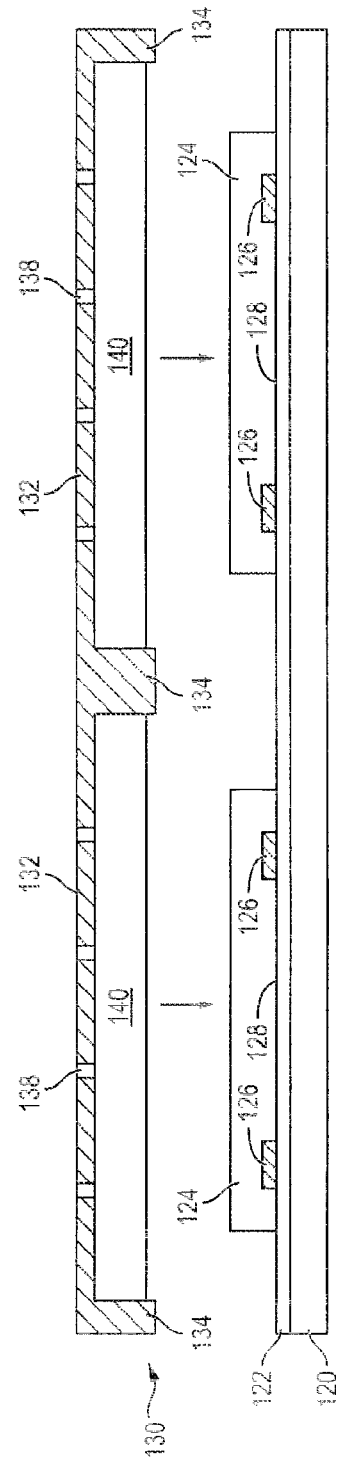

In FIG. 4e, a penetrable material 140 is deposited in cavities 136 prior to mounting over carrier 120 and semiconductor die 124. In one embodiment, B-stage curable encapsulant is deposited in cavities 136 using spin coating or screen printing. Bodies 134 protrude out penetrable material 140 in order to make contact with carrier 120.

Figure 4F:
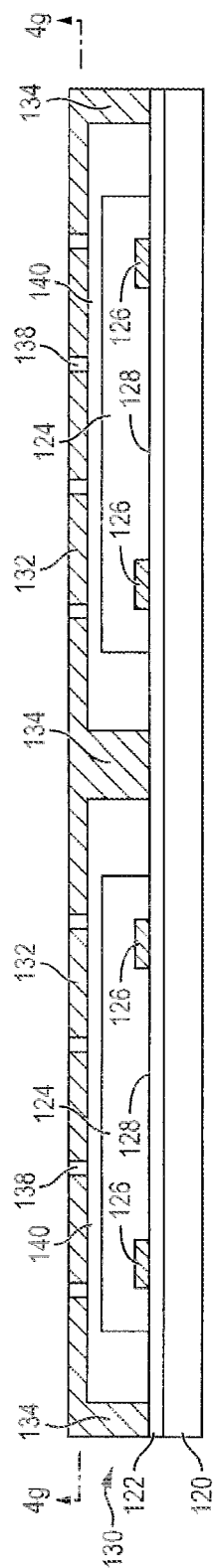
Figure 4G:
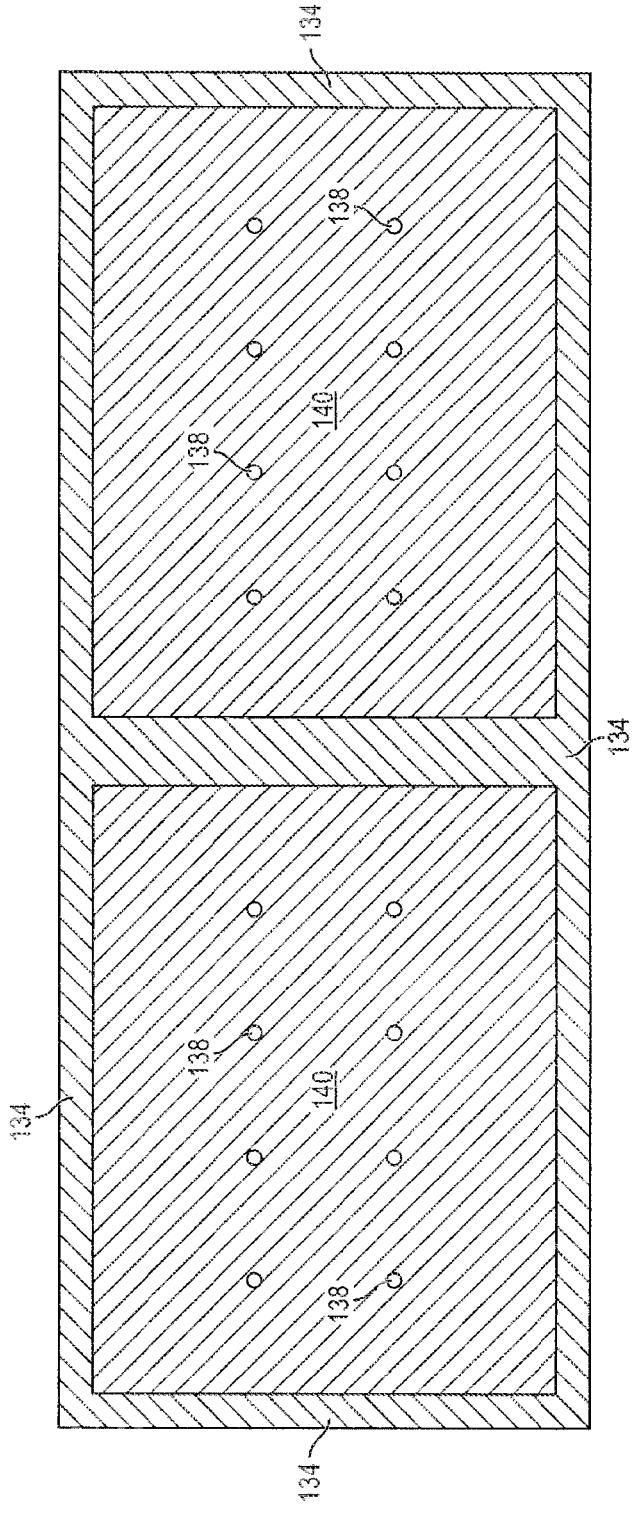

Shielding frame 130 with penetrable material 140 deposited in cavities 136 is positioned over carrier 120 so that the cavities align with mounting sites of semiconductor die 124. Shielding frame 130 is then pressed onto carrier 120 using vacuum press or thermal compression with bodies 134 disposed around semiconductor die 124, as shown in FIG. 4f. The penetrable material encapsulates semiconductor die 124 with excess penetrable material 140 escaping through openings 138 in plate 132. Penetrable material 140 is cured to a hardened state after mounting shielding frame 130 to carrier 120. FIG. 4g shows a cross-sectional view of bodies 134 and penetrable material 140, taken along line 4g-4g of FIG. 4f.

FIG. 4h shows an optional grinding operation where a back surface of plate 132 is planarized by grinder 142 to desired thickness, for example 1-100 micrometers (μm). The portion of plate 132 between bodies 134 is the top surface of shielding frame 130 and bodies 134 are the sides of the shielding frame.

In FIG. 4i, temporary carrier 120 and optional interface layer 122 are removed by chemical etching, mechanical peel-off, CMP, mechanical grinding, thermal bake, laser scanning, or wet stripping.

In FIG. 4j, a build-up interconnect structure 144 is formed over shielding frame 130, penetrable material 140, and active surface 128 of semiconductor die 124. The build-up interconnect structure 144 includes an electrically conductive layer or redistribution layer (RDL) 146 formed using a patterning and metal deposition process such as sputtering, electrolytic plating, and electroless plating. Conductive layer 146 can be one or more layers of Al, Cu, Sn, Ni, Au, Ag, or other suitable electrically conductive material. Conductive layer 146a is electrically connected to contact pads 126 of semiconductor die 124 for signal routing. Conductive layer 146b is electrically connected to bodies 134 for external grounding of shielding frame 130. Other portions of conductive layer 146 can be electrically common or electrically isolated depending on the design and function of semiconductor die 124.

The build-up interconnect structure 144 further includes an insulating or passivation layer 148 formed between conductive layers 146 for electrical isolation. The insulating layer 148 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 148 is formed using PVD, CVD, printing, spin coating, spray coating, sintering or thermal oxidation.

Figure 4K:
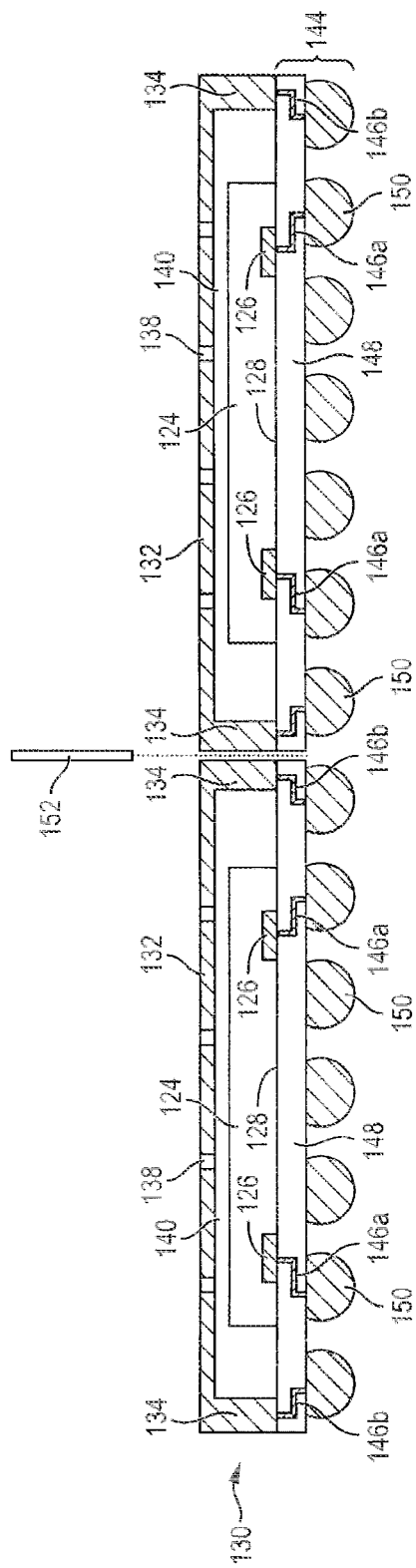

In FIG. 4k, an electrically conductive bump material is deposited over build-up interconnect structure 144 and electrically connected to conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form spherical balls or bumps 150. In some applications, bumps 150 are reflowed a second time to improve electrical contact to conductive layer 146. An under bump metallization (UBM) can be formed under bumps 150. The bumps can also be compression bonded to conductive layer 146. Bumps 150 represent one type of interconnect structure that can be formed over conductive layer 146. The interconnect structure can also use bond wires, stud bump, micro bump, or other electrical interconnect.

Figure 5:
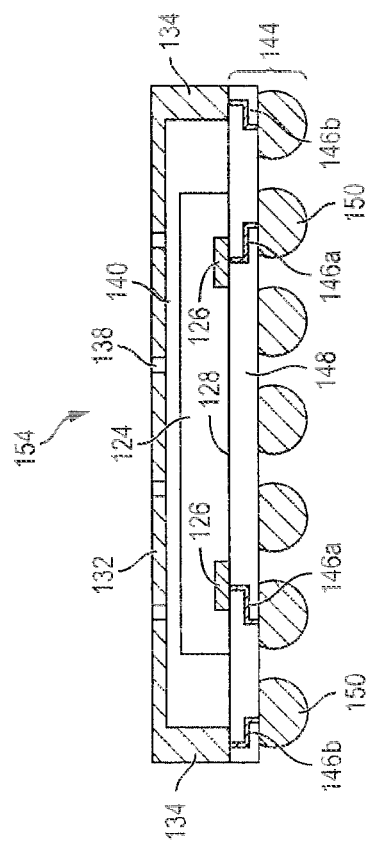
FIG. 5 illustrates the FO-WLCSP with the shielding formed over the semiconductor die.

Shielding frame 130 is singulated through bodies 134 using saw blade or laser cutting tool 152 to separate semiconductor die 124. FIG. 5 shows FO-WLCSP 154 after singulation. Semiconductor die 124 is electrically connected through contact pads 126 and conductive layer 146a to bumps 150. Plate 132 and bodies 134 operate as a shielding layer to block or absorb EMI, RFI, and other inter-device interference. The shielding layer is connected through conductive layer 146b and bumps 150 to an external ground. The shielding layer formed by shielding frame 130 and penetrable material 140 is readily mounted to semiconductor die 124, which reduces manufacturing costs. Penetrable material 140 provides structural support and environmental encapsulation of semiconductor die 124. In addition, penetrable material 140 reduces die shifting and increases alignment accuracy in forming interconnect structure 144.

Figure 6A:
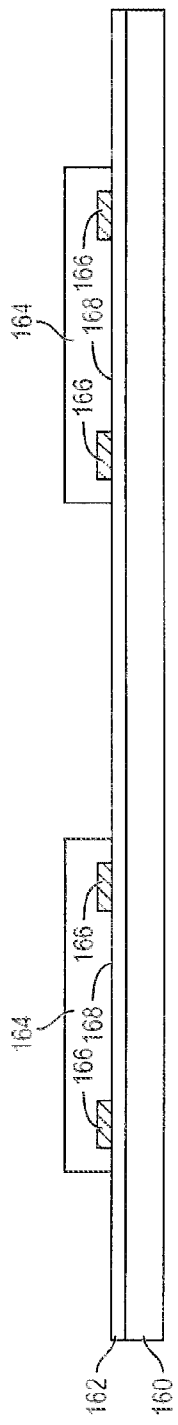

In another embodiment, FIG. 6a shows a wafer-form temporary carrier or dummy wafer substrate 160, similar to carrier 120, containing sacrificial base material such as silicon, polymer, polymer composite, metal, ceramic, glass, glass epoxy, beryllium oxide, or other suitable low-cost, rigid material or bulk semiconductor material for structural support. An optional interface layer 162 can be formed over carrier 160 as a temporary adhesive bonding film or etch-stop layer.

A plurality of semiconductor die or components 164 is mounted to interface layer 162 using a pick and place operation. Contact pads 166 formed over active surface 168 of semiconductor die 164 are oriented downward toward carrier 160. Active surface 168 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 168 to implement analog circuits or digital circuits, such as DSP, ASIC, memory, or other signal processing circuit. Semiconductor die 164 may also contain IPDs, such as inductors, capacitors, and resistors, for RF signal processing. In one embodiment, semiconductor die 164 is a flipchip type semiconductor die.

Figure 6B:
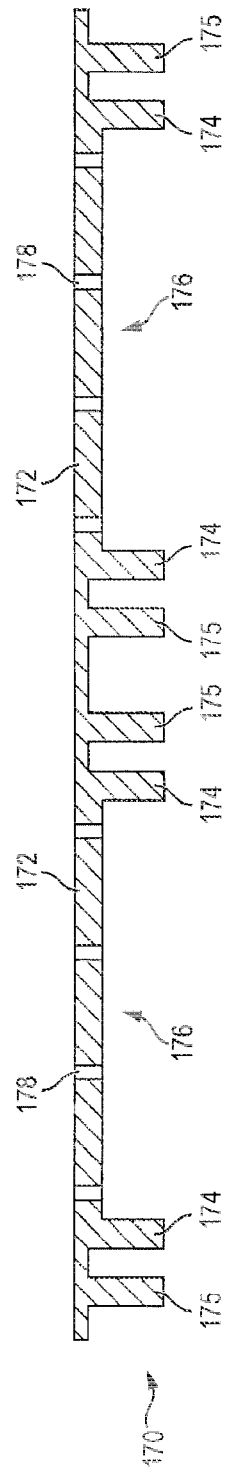

FIG. 6b shows an EMI and RFI shielding frame 170 with a flat plate 172 and plurality of bodies 174 and 175 integrated with and extending perpendicular from the plate. Shielding frame 170 has a similar wafer-shape or form factor as carrier 160. In one embodiment, shielding frame 170 is Cu prefabricated using a leadframe manufacturing process to reduce manufacturing costs. Alternatively, shielding frame 170 can be Al, ferrite or carbonyl iron, stainless steel, nickel silver, low-carbon steel, silicon-iron steel, foil, conductive resin, and other metals and composites capable of blocking or absorbing EMI, RFI, and other inter-device interference. Shielding frame 170 can also be a non-metal material such as carbon-black or aluminum flake to reduce the effects of EMI and RFI. Bodies 174 extend from plate 172 to define cavities or recessed openings 176. Bodies 174 are sufficiently thick to extend down to carrier 160 when shielding frame 170 is mounted over semiconductor die 164. A plurality of openings or mesh 178 is formed in plate 172.

Figure 6C:
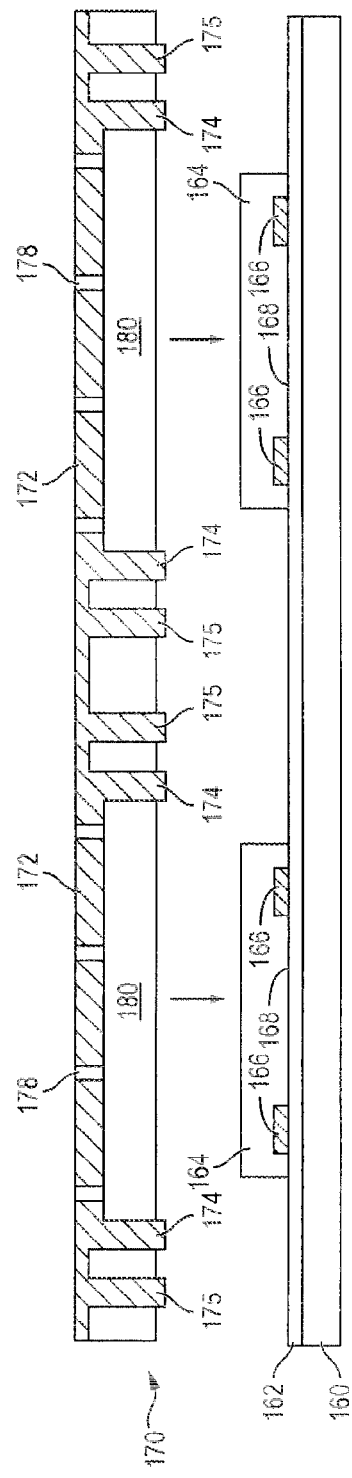

In FIG. 6c, a penetrable material 180 is deposited in cavities 176 prior to mounting over carrier 160 and semiconductor die 164. In one embodiment, B-stage curable encapsulant is deposited in cavities 176 and around bodies 175 using spin coating or screen printing. Bodies 174 and 175 protrude out penetrable material 180 in order to make contact with carrier 160.

Figure 6D:
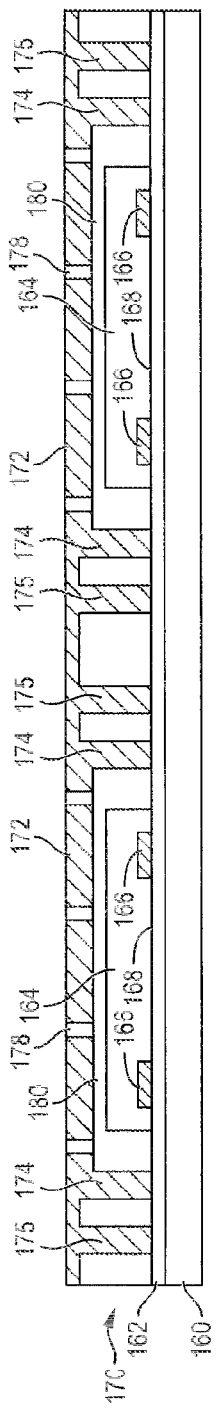

Shielding frame 170 with penetrable material 180 deposited in cavities 176 is positioned over carrier 160 so that the cavities align with mounting sites of semiconductor die 164. Shielding frame 170 is then pressed onto carrier 160 using vacuum press or thermal compression with bodies 174 and 175 disposed around semiconductor die 164, as shown in FIG. 6d. The penetrable material 180 encapsulates semiconductor die 164 and bodies 175. Excess penetrable material 180 escapes through openings 178 in plate 172. Penetrable material 180 is cured to a hardened state after mounting shielding frame 170 to carrier 160.

Figure 6E:
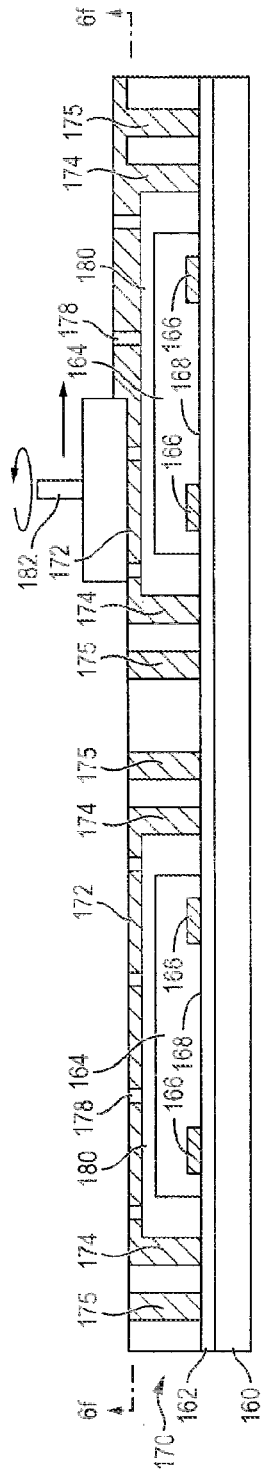

In FIG. 6e, a back surface of plate 172 is planarized by grinder 182 to remove a portion of the plate. The grinding operation separates bodies 175 from plate 172 to operate as z-direction conductive pillars or vias. In addition, laser taper via drilling can be used for 3D contacts after mounting shielding frame 170. The portion of plate 172 between bodies 174 remains as a top surface of shielding frame 170 and bodies 174 are the sides of the shielding frame. FIG. 6f shows a top view of bodies 174 and 175 and penetrable material 180.

Figure 6G:
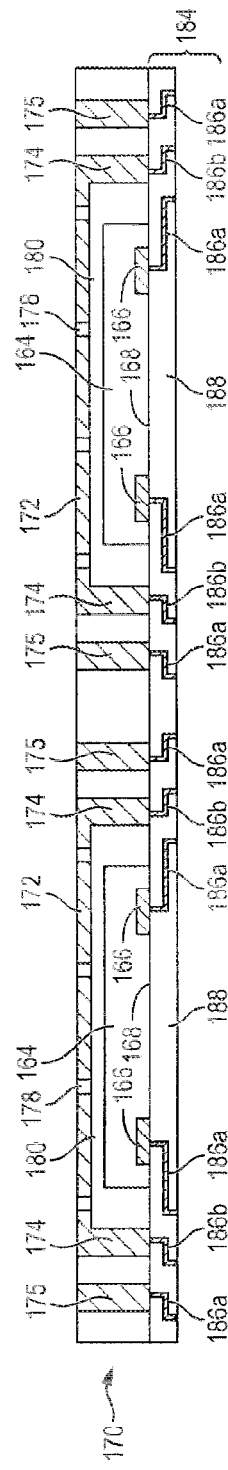
Figure 6F:
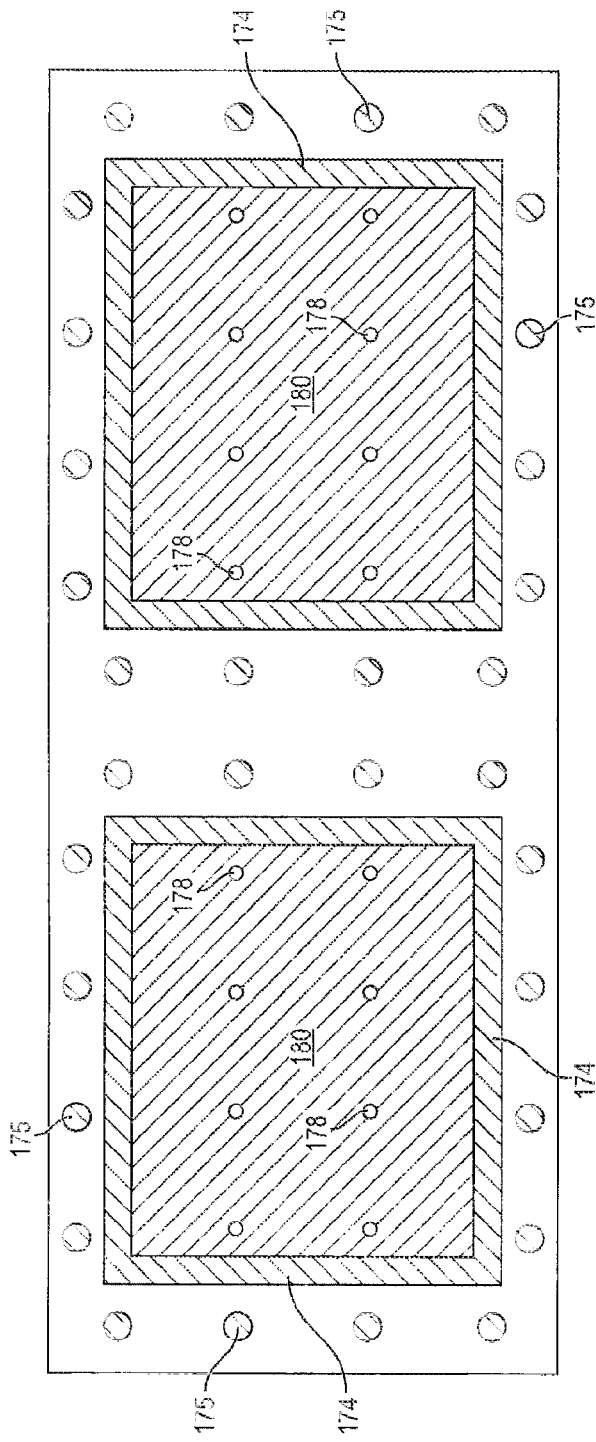

In FIG. 6g, temporary carrier 160 and optional interface layer 162 are removed by chemical etching, mechanical peel-off, CMP, mechanical grinding, thermal bake, laser scanning, or wet stripping. A build-up interconnect structure 184 is formed over shielding frame 170, penetrable material 180, and active surface 168 of semiconductor die 164. The build-up interconnect structure 184 includes an electrically conductive layer or RDL 186 formed using a patterning and metal deposition process such as sputtering, electrolytic plating, and electroless plating. Conductive layer 186 can be one or more layers of Al, Cu, Sn, Ni, Au, Ag, or other suitable electrically conductive material. Conductive layer 186a is electrically connected to contact pads 166 of semiconductor die 164 and bodies 175 for signal routing. Conductive layer 186b is electrically connected to bodies 174 for external grounding of shielding frame 170. Other portions of conductive layer 186 can be electrically common or electrically isolated depending on the design and function of semiconductor die 164.

The build-up interconnect structure 184 further includes an insulating or passivation layer 188 formed between conductive layers 186 for electrical isolation. The insulating layer 188 contains one or more layers of SiO2, Si3N4, SiON, Ta2O5, Al2O3, or other material having similar insulating and structural properties. The insulating layer 188 is formed using PVD, CVD, printing, spin coating, spray coating, sintering or thermal oxidation.

Figure 6H:
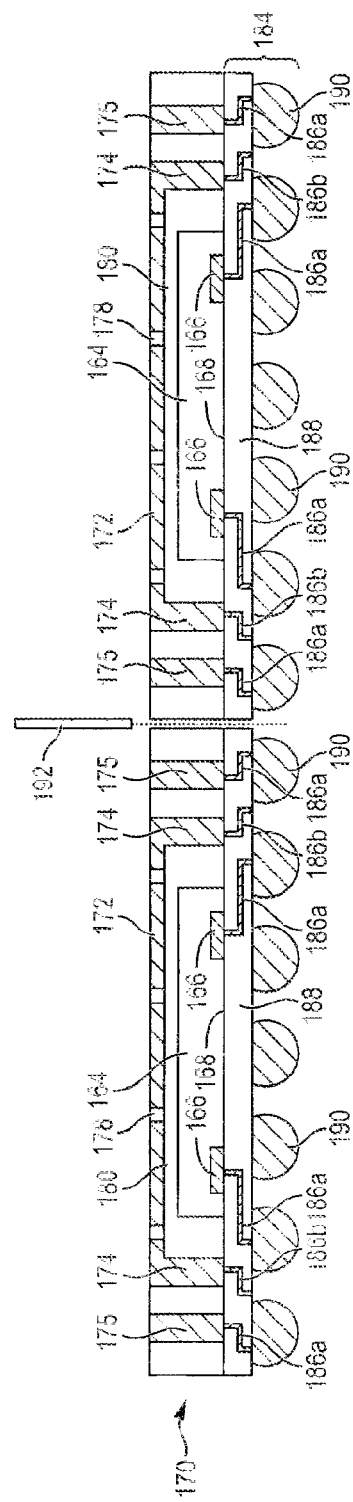

In FIG. 6h, an electrically conductive bump material is deposited over interconnect structure 184 and electrically connected to conductive layer 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form spherical balls or bumps 190. In some applications, bumps 190 are reflowed a second time to improve electrical contact to conductive layer 186. A UBM can be formed under bumps 190. The bumps can also be compression bonded to conductive layer 186. Bumps 190 represent one type of interconnect structure that can be formed over conductive layer 186. The interconnect structure can also use bond wires, stud bump, micro bump, or other electrical interconnect.

Shielding frame 170 is singulated through bodies 174 using saw blade or laser cutting tool 192 to separate semiconductor die 164.

In FIG. 6i, a semiconductor die 194 has an active surface 196 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 196 to implement analog circuits or digital circuits, such as DSP, ASIC, memory, or other signal processing circuit. Semiconductor die 194 may also contain IPDs, such as inductors, capacitors, and resistors, for RF signal processing. A plurality of contact pads 198 is formed over active surface 196 and electrically connected to circuits in the active surface. A plurality of bumps 200 is formed over contact pads 196. Semiconductor die 194 is mounted to z-direction conductive pillars or vias 175 using bumps 200. A plurality of discrete devices 202, such as capacitors, inductors, or resistors, can also be mounted to z-direction conductive pillars 175.

FIG. 7 shows FO-WLCSP 201 after singulation. Semiconductor die 164 is electrically connected through contact pads 166 and conductive layer 186a to bumps 190. Conductive pillars or vias 175 provides additional z-direction electrical interconnect. Plate 172 and bodies 174 operate as a shielding layer to block or absorb EMI, RFI, and other inter-device interference. The shielding layer is connected through conductive layer 186b and bumps 190 to an external ground. The shielding layer formed by shielding frame 170 and penetrable material 180 is readily mounted to semiconductor die 164, which reduces manufacturing costs. Penetrable material 180 provides structural support and environmental encapsulation of semiconductor die 164. In addition, penetrable material 180 reduces die shifting and increases alignment accuracy in forming interconnect structure 184.

In another embodiment, continuing from FIG. 6c, an EMI and RFI shielding frame 210 has a flat plate 212 and bodies 214 integrated with and extending perpendicular from the plate, as shown in FIG. 8a. Shielding frame 210 has a similar wafer-shape or form factor as carrier 160. In one embodiment, shielding frame 210 is Cu prefabricated using a leadframe manufacturing process to reduce manufacturing costs. Alternatively, shielding frame 210 can be Al, ferrite or carbonyl iron, stainless steel, nickel silver, low-carbon steel, silicon-iron steel, foil, conductive resin, and other metals and composites capable of blocking or absorbing EMI, RFI, and other inter-device interference. Shielding frame 210 can also be a non-metal material such as carbon-black or aluminum flake to reduce the effects of EMI and RFI. Bodies 214 extend from plate 212 to define cavities or recessed openings. Bodies 214 are sufficiently thick to extend down to carrier 160 when shielding frame 210 is mounted over semiconductor die 164. A plurality of openings or mesh 216 is formed in plate 212.

A penetrable material 218 is deposited in the cavities prior to mounting over carrier 160 and semiconductor die 164. In one embodiment, B-stage curable encapsulant is deposited into the cavities using spin coating or screen printing. Bodies 214 protrude out penetrable material 218 in order to make contact with carrier 160.

Shielding frame 210 is positioned over carrier 160 so that penetrable material 218 aligns with mounting sites of semiconductor die 164. Shielding frame 210 is then pressed onto carrier 160 using vacuum press or thermal compression with bodies 214 disposed around semiconductor die 164, as shown in FIG. 8b. The penetrable material 218 encapsulates semiconductor die 164. Excess penetrable material 218 escapes through openings 216 in plate 212. Penetrable material 218 is cured to a hardened state after mounting shielding frame 210 to carrier 160.

In FIG. 8c, temporary carrier 160 and optional interface layer 162 are removed by chemical etching, mechanical peel-off, CMP, mechanical grinding, thermal bake, laser scanning, or wet stripping. A build-up interconnect structure 220 is formed over shielding frame 210, penetrable material 218, and active surface 168 of semiconductor die 164. The build-up interconnect structure 220 includes an electrically conductive layer or RDL 222 formed using a patterning and metal deposition process such as sputtering, electrolytic plating, and electroless plating. Conductive layer 222 can be one or more layers of Al, Cu, Sn, Ni, Au, Ag, or other suitable electrically conductive material. Conductive layer 222a is electrically connected to contact pads 166 of semiconductor die 164 for signal routing. Conductive layer 222b is electrically connected to bodies 214 for external grounding of shielding frame 210. Other portions of conductive layer 222 can be electrically common or electrically isolated depending on the design and function of semiconductor die 164.

The build-up interconnect structure 220 further includes an insulating or passivation layer 224 formed between conductive layers 222 for electrical isolation. The insulating layer 224 contains one or more layers of SiO2, Si3N4, SiON, Ta2O5, Al2O3, or other material having similar insulating and structural properties. The insulating layer 224 is formed using PVD, CVD, printing, spin coating, spray coating, sintering or thermal oxidation.

Figure 8D:
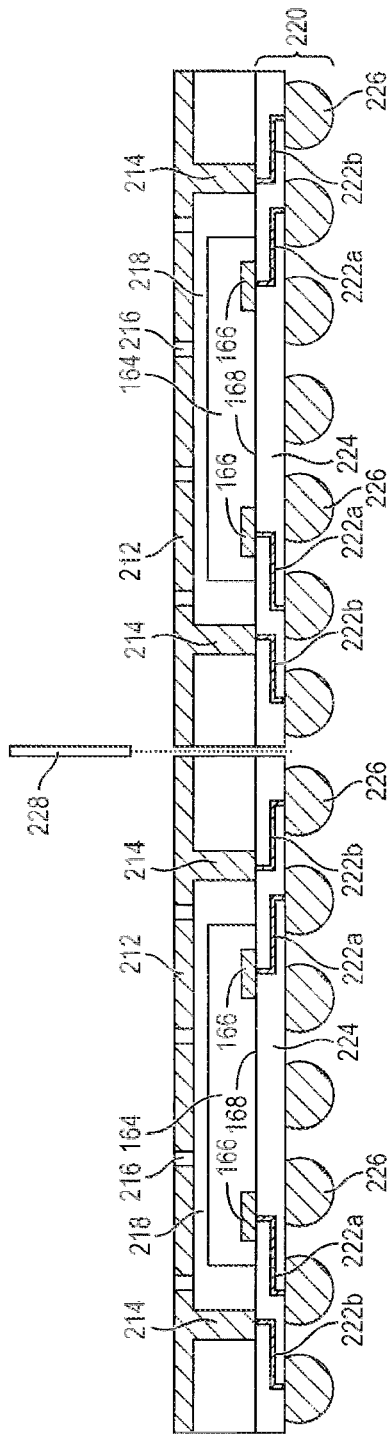

In FIG. 8d, an electrically conductive bump material is deposited over interconnect structure 220 and electrically connected to conductive layer 222 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 222 using a suitable attachment or bonding process. In one embodiment, the bump material is reflowed by heating the material above its melting point to form spherical balls or bumps 226. In some applications, bumps 226 are reflowed a second time to improve electrical contact to conductive layer 222. A UBM can be formed under bumps 226. The bumps can also be compression bonded to conductive layer 222. Bumps 226 represent one type of interconnect structure that can be formed over conductive layer 222. The interconnect structure can also use bond wires, stud bump, micro bump, or other electrical interconnect.

Shielding frame 210 is singulated through plate 212 and penetrable material 218 between bodies 214 using saw blade or laser cutting tool 228 to separate semiconductor die 164. Singulating through plate 212 and penetrable material 218 reduces wear on saw blade 228.

Figure 9:
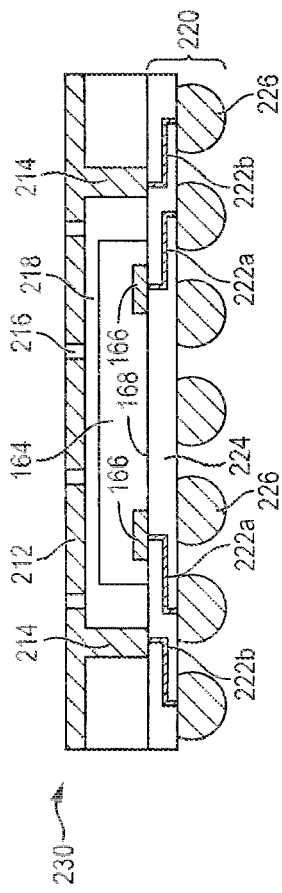
FIG. 9 illustrates the FO-WLCSP with the shielding formed over the semiconductor die.

FIG. 9 shows FO-WLCSP 230 after singulation. Semiconductor die 164 is electrically connected through contact pads 166 and conductive layer 222a to bumps 226. Plate 212 and bodies 214 operate as a shielding layer to block or absorb EMI, RFI, and other inter-device interference. The shielding layer is connected through conductive layer 222b and bumps 226 to an external ground. The shielding layer formed by shielding frame 210 and penetrable material 218 is readily mounted to semiconductor die 164, which reduces manufacturing costs. Penetrable material 218 provides structural support and environmental encapsulation of semiconductor die 164. In addition, penetrable material 218 reduces die shifting and increases alignment accuracy in forming interconnect structure 220.

Figure 10:
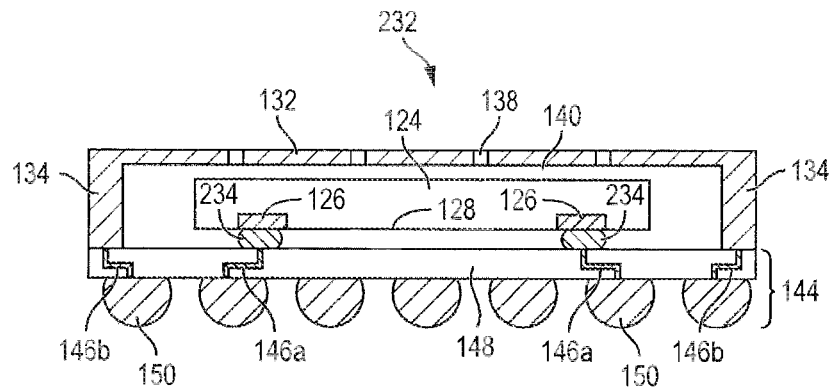
FIG. 10 illustrates bumps formed on a flipchip type semiconductor die which is covered by the shielding frame.

FIG. 10 shows an embodiment of WLCSP 232, similar to FIG. 5, with bumps 234 formed over contact pads 126 of flipchip type semiconductor die 124 and electrically connected to conductive layer 146 of interconnect structure 144.

Figure 11:
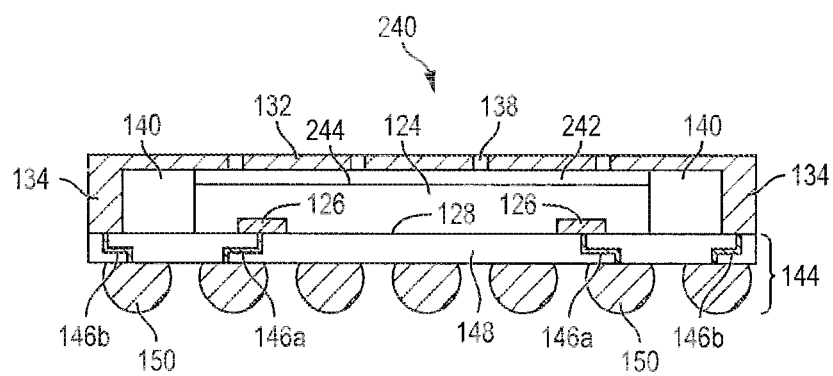
FIG. 11 illustrates a TIM layer formed between a back surface of the semiconductor die and shielding frame.

FIG. 11 shows an embodiment of WLCSP 240, similar to FIG. 5, with thermal interface material (TIM) 242 applied to back surface 244 of semiconductor die 124 prior to mounting shielding frame 130, as described in FIGS. 4e and 4f. TIM 242 can be aluminum oxide, zinc oxide, boron nitride, or pulverized silver. TIM 242 aids in the distribution and dissipation of heat generated by semiconductor die 124.

Figure 12:
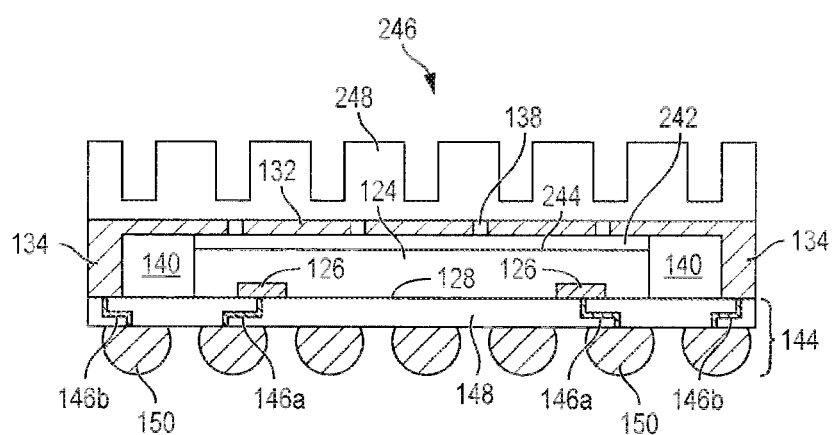
FIG. 12 illustrates a heat sink mounted to the shielding frame.

FIG. 12 shows an embodiment of WLCSP 246, continuing from FIG. 9, with a heat sink 248 mounted over plate 132. Heat sink 248 can be Al, Cu, or another material with high thermal conductivity to provide heat dissipation for semiconductor die 124.

Figure 13:
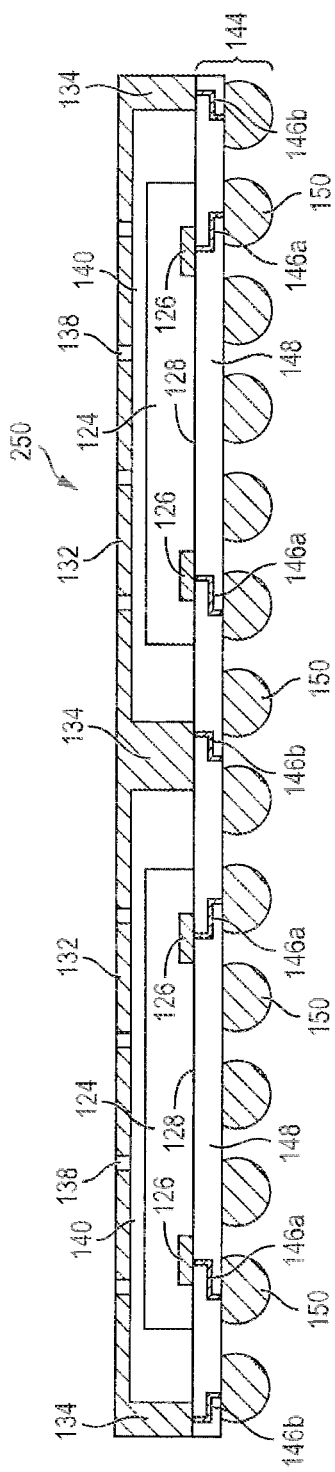
FIG. 13 illustrates two semiconductor die covered by the shielding frame.

FIG. 13 shows an embodiment of WLCSP 250, similar to FIG. 5, with two semiconductor die 124 covered by shielding frame 130 to block or absorb EMI, RFI, and other inter-device interference. Bodies 134 are grounded through conductive layer 146b and bumps 150.

Figure 14:
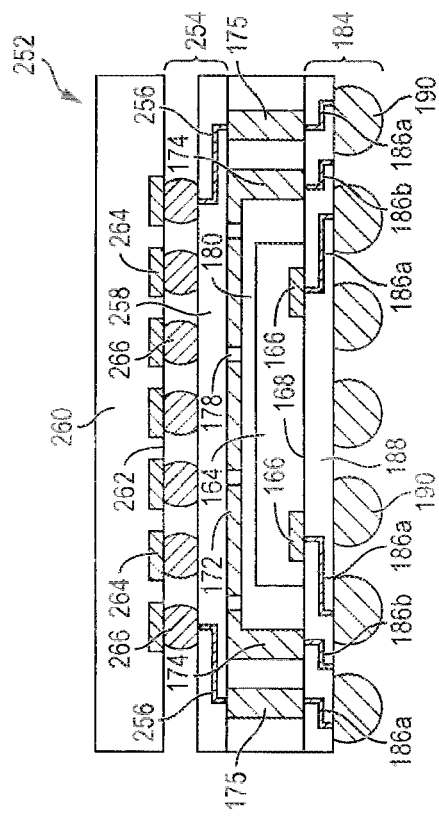
FIG. 14 illustrates a topside interconnect structure formed over the shielding frame and semiconductor die mounted to the topside interconnect structure.

FIG. 14 shows an embodiment of WLCSP 252, continuing from FIG. 7, with an interconnect structure 254 formed over plate 172, bodies 174 and 175, and penetrable material 180. The interconnect structure 254 includes an electrically conductive layer or RDL 256 formed using a patterning and metal deposition process such as sputtering, electrolytic plating, and electroless plating. Conductive layer 256 can be one or more layers of Al, Cu, Sn, Ni, Au, Ag, or other suitable electrically conductive material. One portion of conductive layer 256 is electrically connected to bodies 175. Other portions of conductive layer 256 can be electrically common or electrically isolated depending on the design and function of semiconductor die 124.

The interconnect structure 254 further includes an insulating or passivation layer 258 formed between conductive layers 256 for electrical isolation. The insulating layer 258 contains one or more layers of SiO2, Si3N4, SiON, Ta2O5, Al2O3, or other material having similar insulating and structural properties. The insulating layer 258 is formed using PVD, CVD, printing, spin coating, spray coating, sintering or thermal oxidation.

A semiconductor die 260 has an active surface 262 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 262 to implement analog circuits or digital circuits, such as DSP, ASIC, memory, or other signal processing circuit. Semiconductor die 260 may also contain IPDs, such as inductors, capacitors, and resistors, for RF signal processing. A plurality of contact pads 264 is formed over active surface 262 and electrically connected to circuits in the active surface. A plurality of bumps 266 is formed over contact pads 264. Semiconductor die 260 is mounted to conductive pillars or vias 175 using bumps 266.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a first semiconductor die;
a shielding framed disposed over the first semiconductor die, the shielding frame including a plate and a body integrated with and extending from the plate to define a cavity;
an encapsulant deposited in the cavity;
a plurality of openings formed in the shielding frame to enable excess encapsulant to escape; and
an interconnect structure formed over the first semiconductor die.

2. The semiconductor device of claim 1, further including a conductive via formed through the encapsulant.

3. The semiconductor device of claim 1, further including a bump formed over the first semiconductor die to electrically connect the first semiconductor die to the interconnect structure.

4. The semiconductor device of claim 1, further including a heat sink disposed over the shielding frame.

5. The semiconductor device of claim 1, further including a second semiconductor die disposed over the first semiconductor die.

6. The semiconductor device of claim 1, further including a second semiconductor die disposed adjacent to the first semiconductor die within the shielding frame.

7. A semiconductor device, comprising:
a first semiconductor die;
a shielding frame disposed over the first semiconductor die, the shielding frame including a plate with a plurality of openings and a body integrated with and extending from the plate to define a cavity;
an encapsulant deposited in the cavity; and
an interconnect structure formed over the first semiconductor die.

8. The semiconductor device of claim 7, further including a conductive via formed through the encapsulant.

9. The semiconductor device of claim 7, further including a bump formed over the first semiconductor die to electrically connect the first semiconductor die to the interconnect structure.

10. The semiconductor device of claim 7, further including a heat sink disposed over the shielding frame.

11. The semiconductor device of claim 7, further including a second semiconductor die disposed over the first semiconductor die.

12. The semiconductor device of claim 7, further including a second semiconductor die disposed adjacent to the first semiconductor die within the shielding frame.

13. The semiconductor device of claim 7, wherein the openings in the shielding frame enable excess encapsulant to escape.

14. A semiconductor device, comprising:
a first semiconductor die;
a shielding framed disposed over the first semiconductor die, the shielding frame including a cavity and a plurality of openings;
an encapsulant deposited in the cavity; and
an interconnect structure formed over the first semiconductor die.

15. The semiconductor device of claim 14, further including a conductive via formed through the encapsulant.

16. The semiconductor device of claim 14, wherein the openings in the shielding frame enable excess encapsulant to escape.

17. The semiconductor device of claim 14, further including a heat sink disposed over the shielding frame.

18. The semiconductor device of claim 14, further including a second semiconductor die disposed over the first semiconductor die.

19. The semiconductor device of claim 14, further including a second semiconductor die disposed adjacent to the first semiconductor die within the shielding frame.

20. The semiconductor device of claim 14, wherein the shielding frame includes a plate and a body integrated with and extending from the plate to define the cavity.

21. A semiconductor device, comprising:
a first semiconductor die;
a shielding frame disposed over the first semiconductor die, the shielding frame including a cavity and a plurality of openings; and
an encapsulant deposited in the cavity.

22. The semiconductor device of claim 21, further including a conductive via formed through the encapsulant outside a footprint of the cavity.

23. The semiconductor device of claim 21, further including an interconnect structure formed over the first semiconductor die.

24. The semiconductor device of claim 21, wherein the openings in the shielding frame enable excess encapsulant to escape.

25. The semiconductor device of claim 21, wherein the shielding frame includes a plate and a body integrated with and extending from the plate to define the cavity.

* * * * *